(12) United States Patent
Stegmann et al.

(10) Patent No.: US 11,505,066 B2
(45) Date of Patent: Nov. 22, 2022

(54) OPERATING APPARATUS FOR A VEHICLE COMPONENT AND METHOD FOR PRODUCING FEEDBACK

(71) Applicant: BCS AUTOMOTIVE INTERFACE SOLUTIONS GMBH, Radolfzell (DE)

(72) Inventors: Volker Stegmann, Holm (DE);
Vladimir Mener, Elsenfeld (DE);
Norbert Staudt, Aschaffenburg (DE);
Heinz-Joerg Lefringhausen, Mainhausen (DE); Klaus Weigand, Steinau an der Strasse (DE);
Hans-Juergen Bossler, Muenster (DE)

(73) Assignee: BCS AUTOMOTIVE INTERFACE SOLUTION GMBH, Radolfzell (DE)

( * ) Notice: Subject to any disclaimer, the term of this patent is extended or adjusted under 35 U.S.C. 154(b) by 404 days.

(21) Appl. No.: 16/614,394

(22) PCT Filed: May 30, 2018

(86) PCT No.: PCT/EP2018/064277
§ 371 (c)(1),
(2) Date: Nov. 18, 2019

(87) PCT Pub. No.: WO2018/220064
PCT Pub. Date: Dec. 6, 2018

(65) Prior Publication Data
US 2020/0231039 A1    Jul. 23, 2020

(30) Foreign Application Priority Data

May 31, 2017 (DE) .......................... 102017111897.7

(51) Int. Cl.
*B60K 35/00* (2006.01)
*G01M 1/30* (2006.01)

(52) U.S. Cl.
CPC .............. *B60K 35/00* (2013.01); *G01M 1/30* (2013.01); *B60K 2370/158* (2019.05); *B60K 2370/782* (2019.05)

(58) Field of Classification Search
CPC .............. B60K 35/00; B60K 2370/158; B60K 2370/782; G01M 1/30; H03K 2217/96062; H03K 17/9622; G06F 3/016
See application file for complete search history.

(56) References Cited

U.S. PATENT DOCUMENTS 8,353,111 B2    1/2013 Baldassari et al.
9,489,048 B2    11/2016 Weddle et al.
(Continued)

FOREIGN PATENT DOCUMENTS

CN    1392977 A    1/2003
CN    101734330 A    6/2010
(Continued)

*Primary Examiner* — Ibrahim A Khan
(74) *Attorney, Agent, or Firm* — McNees Wallace & Nurick LLC

(57) ABSTRACT

An operating apparatus for a vehicle component comprises an operating panel (12) as well as an electric motor (34) mechanically coupled thereto with an unbalance mass. A detector (20) can capture the contact of the operating panel (12) by a user. A sensor (46) is provided in order to set exactly the number of revolutions of the electric motor in response to the contact of the operating panel by a user. The number of revolutions of the rotor is determined via this sensor.

11 Claims, 1 Drawing Sheet

(56) References Cited

U.S. PATENT DOCUMENTS

| | | | |
|---|---|---|---|
| 10,415,965 B2* | 9/2019 | Fedigan | G01C 9/06 |
| 2002/0149561 A1* | 10/2002 | Fukumoto | G06F 3/04886 |
| | | | 345/156 |
| 2004/0075360 A1 | 4/2004 | Stadelmann | |
| 2008/0073131 A1 | 3/2008 | Cruz-Hermandez et al. | |
| 2009/0200880 A1* | 8/2009 | Mortimer | B06B 1/10 |
| | | | 310/81 |
| 2010/0126299 A1 | 5/2010 | Baldassari et al. | |
| 2010/0238132 A1* | 9/2010 | Schmidt | G06F 3/04886 |
| | | | 340/407.1 |
| 2012/0120008 A1 | 5/2012 | Mori | |
| 2012/0232780 A1* | 9/2012 | Delson | A63F 13/803 |
| | | | 340/407.1 |
| 2014/0104209 A1 | 4/2014 | Ueno | |
| 2014/0139450 A1 | 5/2014 | Levesque et al. | |
| 2014/0160044 A1* | 6/2014 | Yairi | F04B 43/10 |
| | | | 345/173 |
| 2015/0097796 A1* | 4/2015 | Lisseman | G06F 3/0414 |
| | | | 345/173 |
| 2015/0169056 A1 | 6/2015 | Weddle et al. | |
| 2015/0227200 A1 | 8/2015 | Norieda | |
| 2015/0331399 A1 | 11/2015 | Hackl et al. | |
| 2016/0258758 A1* | 9/2016 | Houston | G01D 5/145 |
| 2017/0021762 A1* | 1/2017 | Daman | B60Q 9/00 |
| 2017/0136354 A1* | 5/2017 | Yamano | G06F 1/1632 |
| 2018/0239388 A1 | 8/2018 | Ulrich et al. | |
| 2018/0348865 A1* | 12/2018 | Czelnik | B60K 37/06 |
| 2018/0356889 A1* | 12/2018 | Khoshkava | G06F 3/0412 |

FOREIGN PATENT DOCUMENTS

| | | |
|---|---|---|
| CN | 104714687 A | 6/2015 |
| CN | 104903803 A | 9/2015 |
| DE | 102014018355 A1 | 6/2016 |
| DE | 102015216390 B3 | 12/2016 |

\* cited by examiner

OPERATING APPARATUS FOR A VEHICLE COMPONENT AND METHOD FOR PRODUCING FEEDBACK

RELATED APPLICATIONS

This application corresponds to PCT/EP2018/064277, filed May 30, 2018, which claims the benefit of German Application No. 10 2017 111 897.7 filed May 31, 2017, the subject matter of which are incorporated herein by reference in their entirety.

BACKGROUND

The invention relates to an operating apparatus for a vehicle component and a method for producing haptic feedback when an operating apparatus of a vehicle component is actuated.

In vehicles, modern operating systems are increasingly seldomly designed as electromechanical switch modules with perceptibly movable buttons, but rather as touch-sensitive systems which activate a vehicle function in response to a touch. The touched area of the operating panel no longer moves in the case of contact with the operator's finger, as a result of which no haptic feedback is effected for a successful operation. These operating apparatuses are similar to those of touch panels in mobile telephones or tablet computers. Such an operating panel is usually provided with several segments (switch surfaces) which are combined on one operating panel for the operation of different functions and correspond functionally to the several electromechanical switches previously known. The outer face of the operating panel is defined by a sheet-like part which usually has symbols integrated into the different areas.

In order to be able to provide haptic feedback when successful operation is effected, so-called unbalance motors have become accepted. These unbalance motors comprise an electric motor with an unbalance mass, i.e. either a rotor which has an unbalance or a separate unbalance mass coupled to the rotor. The electric motor is mechanically coupled to the operating panel and ensures a vibration of the operating panel, more precisely the sheet, as soon as the contact of the operating panel by a user is captured by a detector. Such detectors can be, for example, force sensors, resistive or capacitive sensors or the like. The present invention is not limited to a particular type of detector.

After a specific period of time, the electric motor is switched off again, with the result that the vibration of the sheet-like part ceases.

From US 2014/0139450 A1 a system for producing haptic feedback of an operating surface is known in which piezoelectric actuators produce pulses.

DE10 2014 018 355 A1 shows a touchpad in a vehicle which, under the glass panel, has sensors for detecting haptic pulses of the operator.

US 2004/0075360 A1 discloses an electric switch, in particular a piezo switch, which can provide the operator with haptic feedback, and uses an unbalance motor for this.

US 2014/0104209 A1 describes a touchpad with haptic feedback, in which a cam moves a mechanical transmission mechanism towards the surface of the touchpad and stimulates vibrations.

SUMMARY

The object of the invention is to create a higher-quality operating apparatus compared with the state of the art and in addition an improved method for producing haptic feedback.

The object is achieved on the one hand by an operating apparatus for a vehicle component, with an operating panel, an electric motor having an unbalance mass, the electric motor being mechanically coupled to the operating panel, with a detector for determining a contact of the operating panel by a user, a sensor for determining the rotation of the rotor of the electric motor and a control unit which is connected to the electric motor, to the detector and to the sensor, wherein the control unit is set up in such a way that it actuates the electric motor when contact of the operating panel is detected and initiates a rotor rotation in order to produce haptic feedback on the operating panel, and wherein the control unit is furthermore set up in such a way that it stops the electric motor after detection of a predefined number of revolutions.

Unlike the state of the art, in the operating apparatus according to the invention the number of rotations of the rotor is determined via a sensor and the rotor is stopped when a predefined number of rotations is reached. The number of revolutions desired can thus be set exactly in a simple manner, above all relatively few revolutions can be realized. Environmental conditions or age-related variations when the electric motor is started no longer lead to a higher or lower number of revolutions during a predefined switch-on time. The electric motor rotates exactly as often as has previously been set.

The sensor is in particular a proximity sensor, which is oriented towards a part rotated by the electric motor such that it detects the rotation thereof. This part captured by the sensor can be the rotor itself or a separate unbalance mass coupled to the rotor.

In the case of the assignment of the proximity sensor to the unbalance mass, the proximity sensor is arranged stationary opposite a radial outer face of the unbalance mass according to the preferred embodiment.

Preferably, the unbalance mass has an outer circumference which has segments at different distances from the rotor axis. The segment at the greatest distance from the rotor axis, the notional centre axis of the rotor is meant here, is then captured by the sensor during rotation.

The sensor should be designed such that it can detect a complete revolution of the rotor. It is not absolutely necessary for the sensor to be designed in the manner of a rotation angle sensor which can capture the current position of the rotor.

The control unit of the electric motor is formed such that it actuates the electric motor in such a way that the rotor performs at least two complete revolutions when a contact of the operating panel is detected. This number of revolutions is relatively small, but it is sufficient to provide reliable feedback. In addition, too many revolutions and an associated whirring noise that lasts too long are often perceived as annoying by the operator. Preferably, fewer than ten, in particular fewer than five, revolutions should be performed, whereupon the electric motor is stopped.

The object is achieved in addition by a method for producing haptic feedback when an operating apparatus of a vehicle component, in particular an operating apparatus according to the invention, is actuated, by the following steps:

a) detecting a contact of the operating panel,
b) energizing an electric motor mechanically coupled to the operating panel, with the result that the rotor and an unbalance mass rotate in order to produce haptic feedback on the operating panel,
c) determining the number of complete revolutions of the rotor, and d) altering the energization of the electric motor depending on the number of complete revolutions which the rotor of the electric motor has already performed.

As previously mentioned, the rotor itself can already have a segment which acts as the unbalance mass, or an unbalance mass can be secured on the rotor. The energization of the electric motor leads to the pausing of the rotor.

The method according to the invention provides that the electric motor is preferably energized such that the rotor performs at least two complete revolutions, in particular at most ten, further in particular at most five complete revolutions.

In step d) the electric motor can be stopped by energization in the opposite direction.

DESCRIPTION OF THE DRAWINGS

Further features and advantages of the invention emerge from the following description and the following drawings, to which reference is made. In the drawings there are shown in.

DETAILED DESCRIPTION

Figure 1:
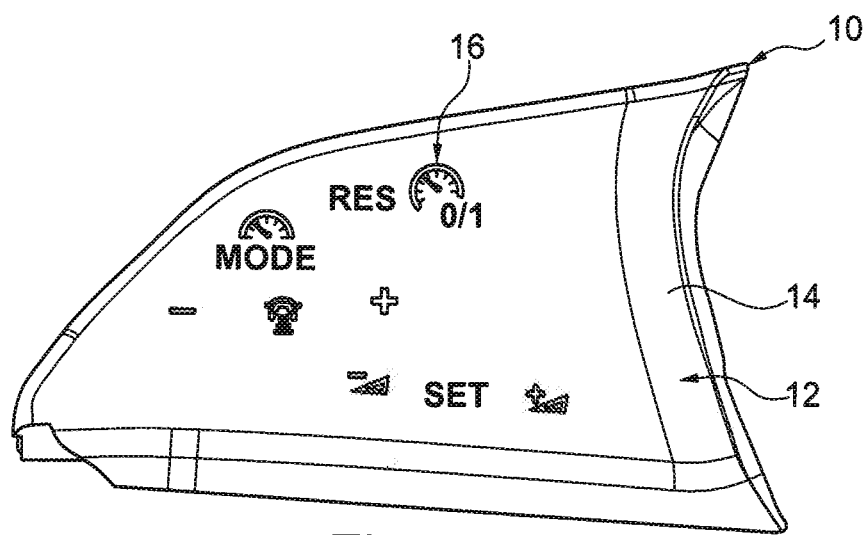
FIG. 1 a top view of an example of an operating apparatus according to the invention, FIG. 2 a schematic cross-sectional view through the operating apparatus according to the invention, and FIG. 3 a schematic view of a unit consisting of electric motor and sensor system used in the operating apparatus according to the invention.

In FIG. 1 an operating apparatus 10 is represented which is built into a motor vehicle, in the area of the steering wheel here. However, it is to be emphasized that the structure of this operating apparatus, which is explained in the following, can naturally also be implemented in another operating apparatus, which is built into the area of the dashboard, the centre console or at other points in the vehicle interior.

In FIG. 1 the operating panel 12 is to be seen, which is defined on the outer face by a thin sheet-like part 14. Several switch symbols 16 are provided on the operating panel 12. These switch symbols 16 can be printed onto the sheet-like part 14; they are backlit in every case. For this, the sheet-like part 14 is transparent or translucent in segments.

The surface of the operating panel is continuous and smooth; there is no gap between the switch symbols 16. Rather, the sheet-like part is a continuous, one-piece, substantially rigid body, in particular made of plastic. Switch surfaces, which replace conventional switches, are formed around the switch symbols 16.

Figure 2:
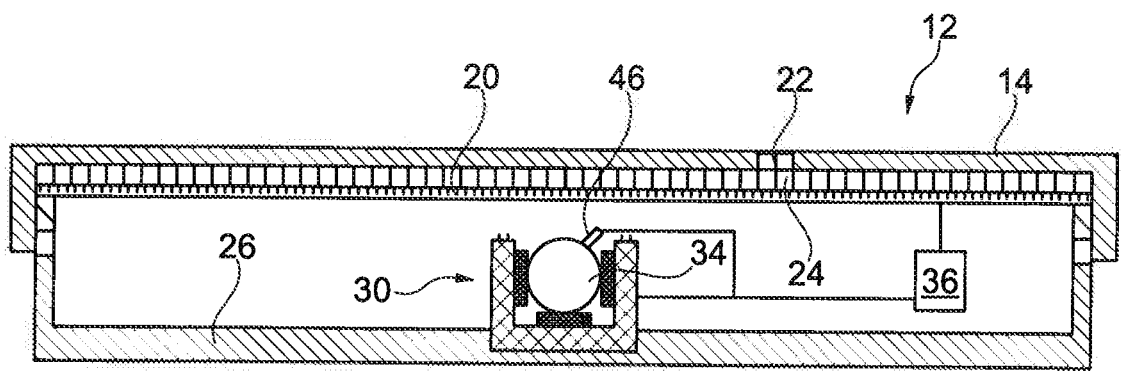

A schematic section through the operating apparatus according to FIG. 1 is represented in FIG. 2. It is to be seen that the sheet-like part 14 is designed in the form of a cover, under which there is a detector 20 in the form of a, for example capacitive, sensor film which can determine, for each switch symbol 16 and the switch surface formed in this area, whether a user is touching the switch surface or not.

Transparent or translucent segments 22 in the sheet-like part 12 to form the switch symbols 16 are likewise represented in FIG. 2. Light sources 24 can furthermore be present on the underside of the sheet-like part 12.

The unit consisting of sheet-like part 12 and detector 20 sits on a frame 26, which is hollow inside and is closed by the cover. An electric motor 30, which has a rotor 34, sits in the thus-produced cavity and on the frame 26. It is a so-called unbalance motor. The electric motor 30, like the detector 20, is coupled to a controller 36, which is, for example, a printed circuit board.

Figure 3:
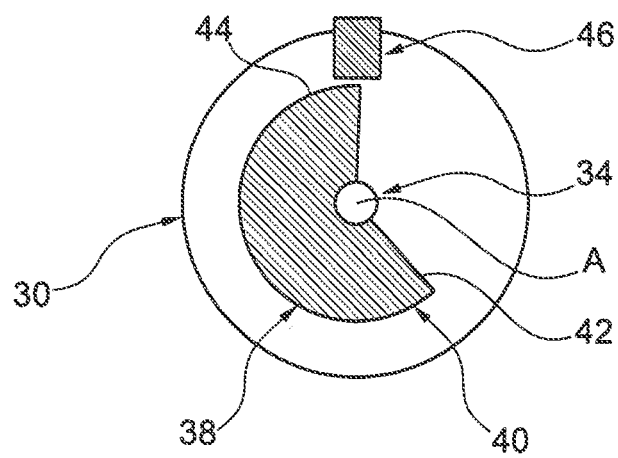

FIG. 3 shows the electric motor unit with the electric motor 30 as well as its rotor 34 in schematic detail. An unbalance mass 38, which has an outer circumference 40 which has at least one segment 42 which is at a smaller distance from the rotor axis A than a segment 44 at a radially further outward distance, sits on the rotor 34.

A sensor 46, which is likewise coupled to the controller 36, lies so close to the unbalance mass 38 that it trips during rotation when the segment 44 is opposite it, as is represented, for example, in FIG. 3.

The number of rotations of the rotor 34 is detected via the sensor 46.

As soon as a touch of an operating panel in the area of a switch surface is detected, the controller 36 ensures that the electric motor 30 is energized, and that rotor 34 and unbalance mass 38 rotate. Because the electric motor 30 is mechanically connected to the sheet-like part 14 via the frame 26, the sheet-like part is vibrated in order to provide haptic feedback on the operating panel 12 to the operator.

As soon as more than two complete revolutions are detected, preferably fewer than ten, in particular even fewer than five complete revolutions, the controller 36 pauses the energization of the electric motor in a corresponding direction and energizes it in the opposite direction, in order to stop it.

It is to be emphasized that the number of complete revolutions is stored in the controller 36 in advance, with the result that the number of vibrations is exactly fixed and also complied with.

The invention claimed is:

1. An operating apparatus for a vehicle component, comprising:
an operating panel, an electric motor having an unbalance mass and being mechanically coupled to the operating panel, a detector for determining a contact of the operating panel by a user, a sensor for determining a rotation of a rotor of the electric motor and a control unit which is connected to the electric motor, to the detector and to the sensor, wherein the control unit is set up in such a way that it actuates the electric motor when contact of the operating panel is detected and initiates a rotor rotation in order to produce haptic feedback on the operating panel, wherein the control unit is further set up in such a way that it stops the electric motor after detection of a predefined number of revolutions, and wherein the control unit actuates the electric motor in such a way that the rotor performs at least two complete revolutions and fewer than five when a contact of the operating panel is detected.

2. The operating apparatus according to claim 1, wherein the sensor is a proximity sensor, which is oriented towards a part rotated by the electric motor such that it detects the rotation thereof.

3. An operating apparatus according to claim 2, wherein the proximity sensor is arranged stationary opposite a radial outer face of the unbalance mass.

4. An operating apparatus according to claim 1, wherein the unbalance mass is formed as a separate part and secured on the rotor.

5. An operating apparatus according to claim 1, wherein the unbalance mass has an outer circumference which has segments at different distances from the rotor axis.

6. An operating apparatus according to claim 1, wherein the sensor is formed in such a way that it can detect a complete revolution of the rotor.

7. A method for producing haptic feedback when an operating apparatus of a vehicle component, is actuated, the method comprising:

a) detecting a contact of an operating panel, b) energizing an electric motor mechanically coupled to the operating panel, with the result that a rotor and an unbalance mass rotate in order to produce haptic feedback on the operating panel, wherein the electric motor is energized such that the rotor performs at least two complete revolutions and at most five revolutions, c) determining the number of complete revolutions of the rotor, and d) altering the energization of the electric motor depending on the number of complete revolutions which the rotor of the electric motor has already performed.

8. The method according to claim 7, wherein in step d) the electric motor is stopped by energization in the opposite direction.

9. An operating apparatus according to claim 1, wherein the control unit actuates the electric motor in such a way that the rotor performs at least two complete revolutions when a contact of the operating panel is detected, and fewer than ten revolutions.

10. The method according to claim 7, wherein the electric motor is energized such that the rotor performs at least two complete revolutions and at most ten revolutions.

11. The method according to claim 7, wherein the vehicle component is an operating apparatus for a vehicle component, with an operating panel, an electric motor having an unbalance mass and being mechanically coupled to the operating panel, a detector for determining a contact of the operating panel by a user, a sensor for determining the rotation of the rotor of the electric motor and a control unit which is connected to the electric motor, to the detector and to the sensor, wherein the control unit is set up in such a way that it actuates the electric motor when contact of the operating panel is detected and initiates a rotor rotation in order to produce haptic feedback on the operating panel, and wherein the control unit is furthermore set up in such a way that it stops the electric motor after detection of a predefined number of revolutions.

* * * * *